United States Patent [19]
Narita

[11] Patent Number: 5,559,362
[45] Date of Patent: Sep. 24, 1996

[54] SEMICONDUCTOR DEVICE HAVING DOUBLE METAL CONNECTION LAYERS CONNECTED TO EACH OTHER AND TO THE SUBSTRATE IN THE SCRIBE LINE AREA

[75] Inventor: Kaoru Narita, Tokyo, Japan

[73] Assignee: NEC Corporation, Tokyo, Japan

[21] Appl. No.: 323,836

[22] Filed: Oct. 17, 1994

[30] Foreign Application Priority Data

Oct. 27, 1993 [JP] Japan .................................. 5-291162

[51] Int. Cl.$^6$ .............................. H01L 23/58; H01L 29/40
[52] U.S. Cl. ........................... 257/620; 257/629; 437/226
[58] Field of Search .................................. 257/620, 758, 257/629, 630, 773; 437/226, 227

[56] References Cited

U.S. PATENT DOCUMENTS

| | | | |
|---|---|---|---|
| 4,364,078 | 12/1982 | Smith et al. | 257/620 |
| 4,835,592 | 5/1989 | Zommer | 257/620 |
| 5,300,816 | 4/1994 | Lee et al. | 257/620 |
| 5,391,920 | 2/1995 | Tsuji | 257/758 |

FOREIGN PATENT DOCUMENTS

| | | | |
|---|---|---|---|
| 0094625 | 4/1989 | Japan . | |
| 0054563 | 2/1990 | Japan . | |
| 0188942 | 7/1990 | Japan | 437/226 |
| 0259165 | 10/1993 | Japan | 257/620 |
| 0267257 | 10/1993 | Japan | 257/620 |

OTHER PUBLICATIONS

By Tanaka, Masaki et al., "An Advanced ESD Test Method for Charged Device Model", *EOS/ESD Symposium*, 1992, pp. 76–87. No month.

*Primary Examiner*—Peter Toby Brown
*Attorney, Agent, or Firm*—Young & Thompson

[57] ABSTRACT

In a semiconductor device having two metal connection layers formed on a scribe line area, the metal connection layers are connected to each other and further to a semiconductor substrate. The two metal connection layers are connected to each other via contact holes arranged along the scribe line area. This enhances heat dissipation and heat conductivity to allow heat to be rapidly transferred to the semiconductor substrate.

12 Claims, 11 Drawing Sheets

5,559,362

SEMICONDUCTOR DEVICE HAVING DOUBLE METAL CONNECTION LAYERS CONNECTED TO EACH OTHER AND TO THE SUBSTRATE IN THE SCRIBE LINE AREA

BACKGROUND OF THE INVENTION

1. Field of the Invention

The present invention relates to a semiconductor device, and more particularly, to a metal connection configuration formed on a scribe line area thereof.

2. Description of the Related Art

Scribe line areas are provided to partition semiconductor chips in a wafer. In a prior art semiconductor device, all metal layers and insulating layers are removed from the scribe line areas thereof; however, in this case, a step between the scribe line areas and the other areas is enlarged, so that the manufacturing yield is reduced by etching defects created in the post processes.

In order to reduce the above-mentioned step, an insulating layer partly and forcibly remains in the scribe line areas (see: JP-A-HEI2-54563). Also, a scribe connection layer is formed in the scribe line areas, and the scribe connection layer is connected to a ground voltage terminal or a substrate potential generating circuit, to thereby stabilize the potential at a semiconductor substrate.

Also, it is known to use double metal connection layers as a scribe connection, to thereby further reduce the above-mentioned step (see: JP-A-HEI1-94625). In this case, however, the heat dissipation effect is not sufficient, and as a result, the scribe connection is melted when a large current flows therethrough. This will be explained later in detail.

SUMMARY OF THE INVENTION

It is an object of the present invention to enhance the heat dissipation effect of a double metal connection configuration formed in a scribe line area of a semiconductor device.

According to the present invention, in a semiconductor device having two metal connection layers formed on a scribe line area, the metal connection layers are both connected directly to a semiconductor substrate. Thus, heat generated from each of the metal connection layers is dissipated into the semiconductor substrate.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art semiconductor devices will be explained with reference to FIGS. 1 through 4.

Figure 1:
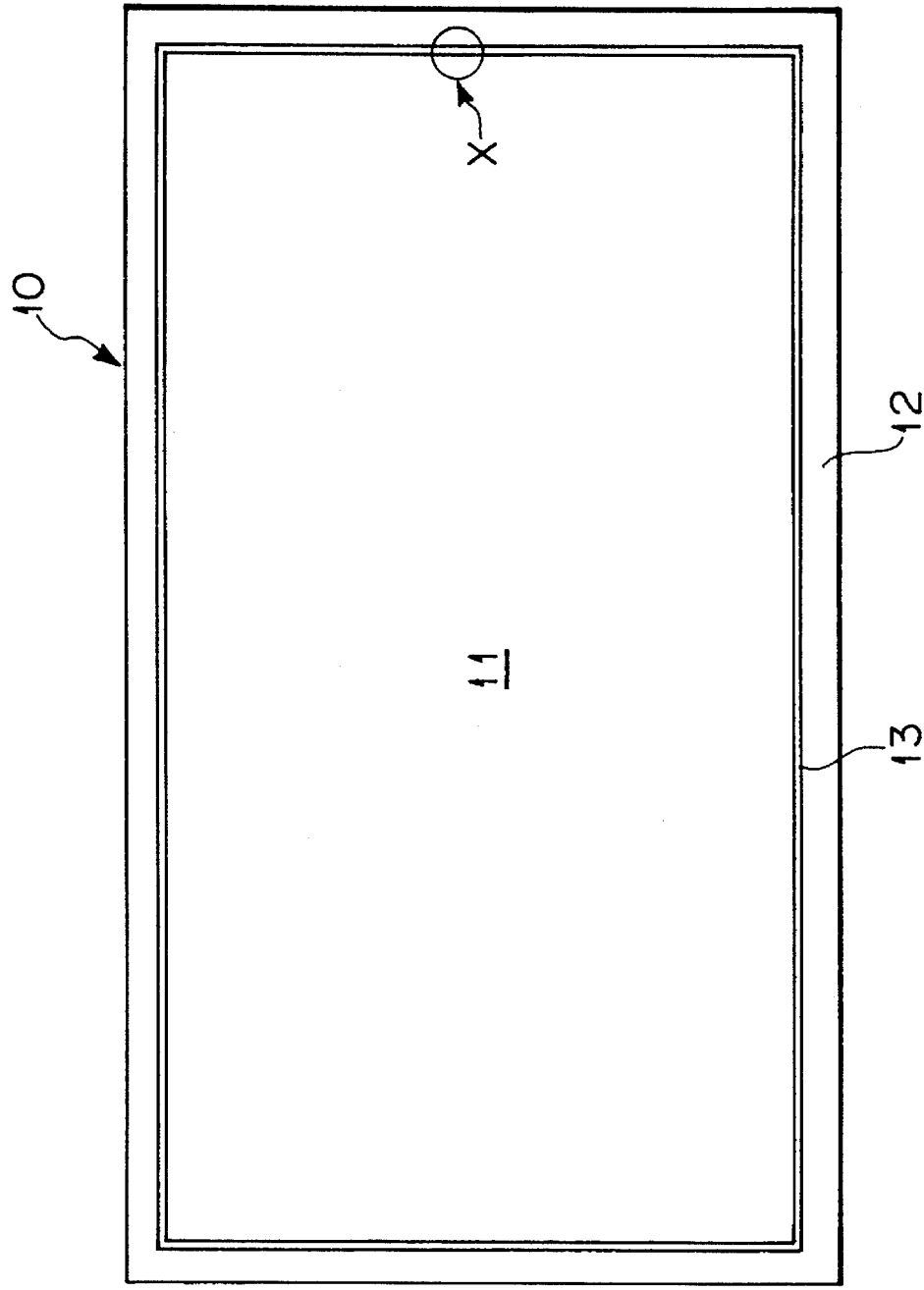
FIG. 1 is plan view illustrating a prior art semiconductor device.

In FIG. 1, which illustrates a prior art semiconductor device, a scribe connection layer and insulating layers are provided in a scribe line area. That is, a semiconductor device (chip) 10 is divided into an element forming area 11 and a scribe line area 12 at the periphery of the element forming area 11. Also, a scribe connection layer 13 is provided in the scribe line area 12.

Figure 2:
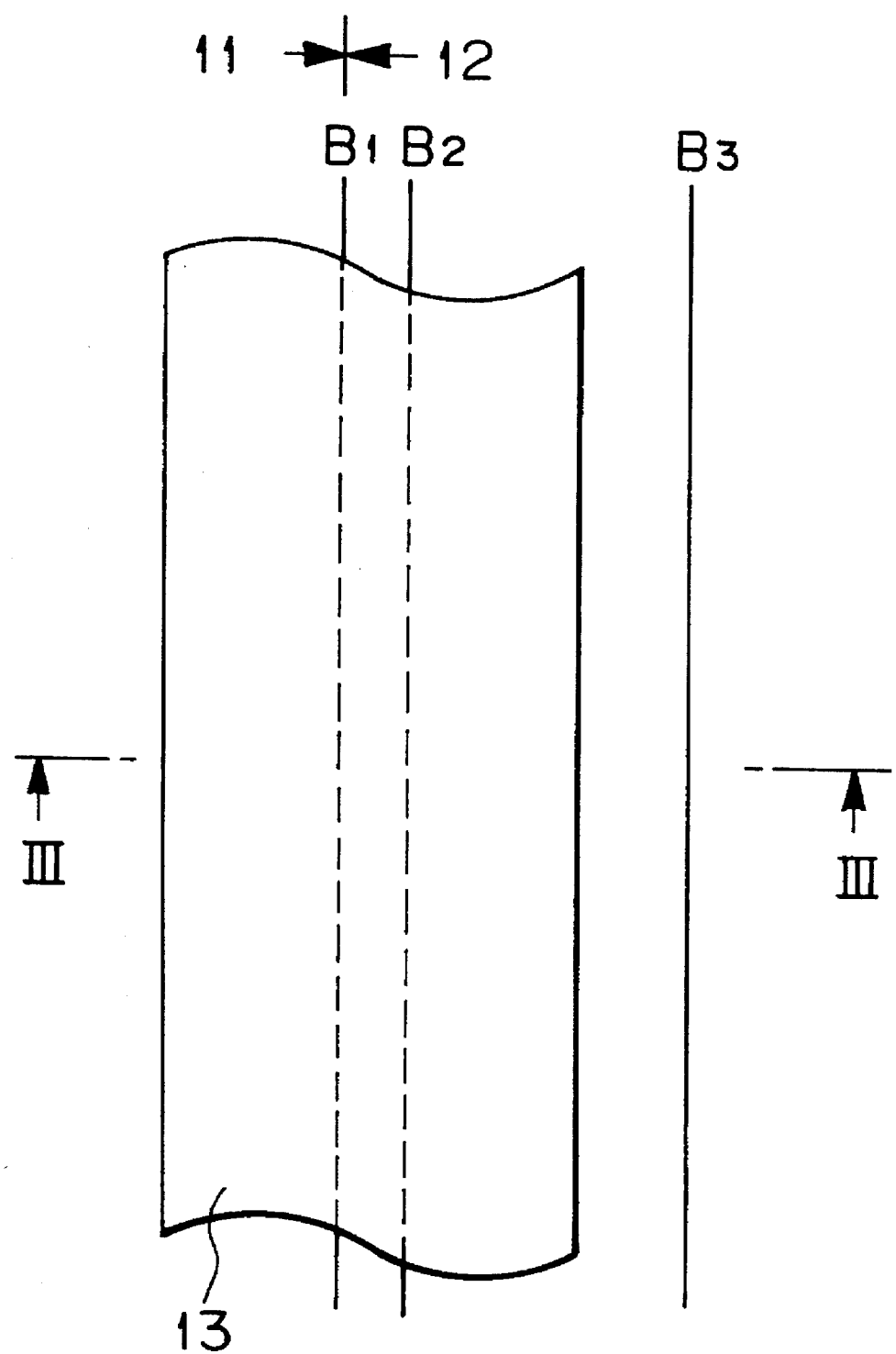
FIG. 2 is a plan view illustrating an enlargement of the portion X of FIG. 1.
Figure 3:
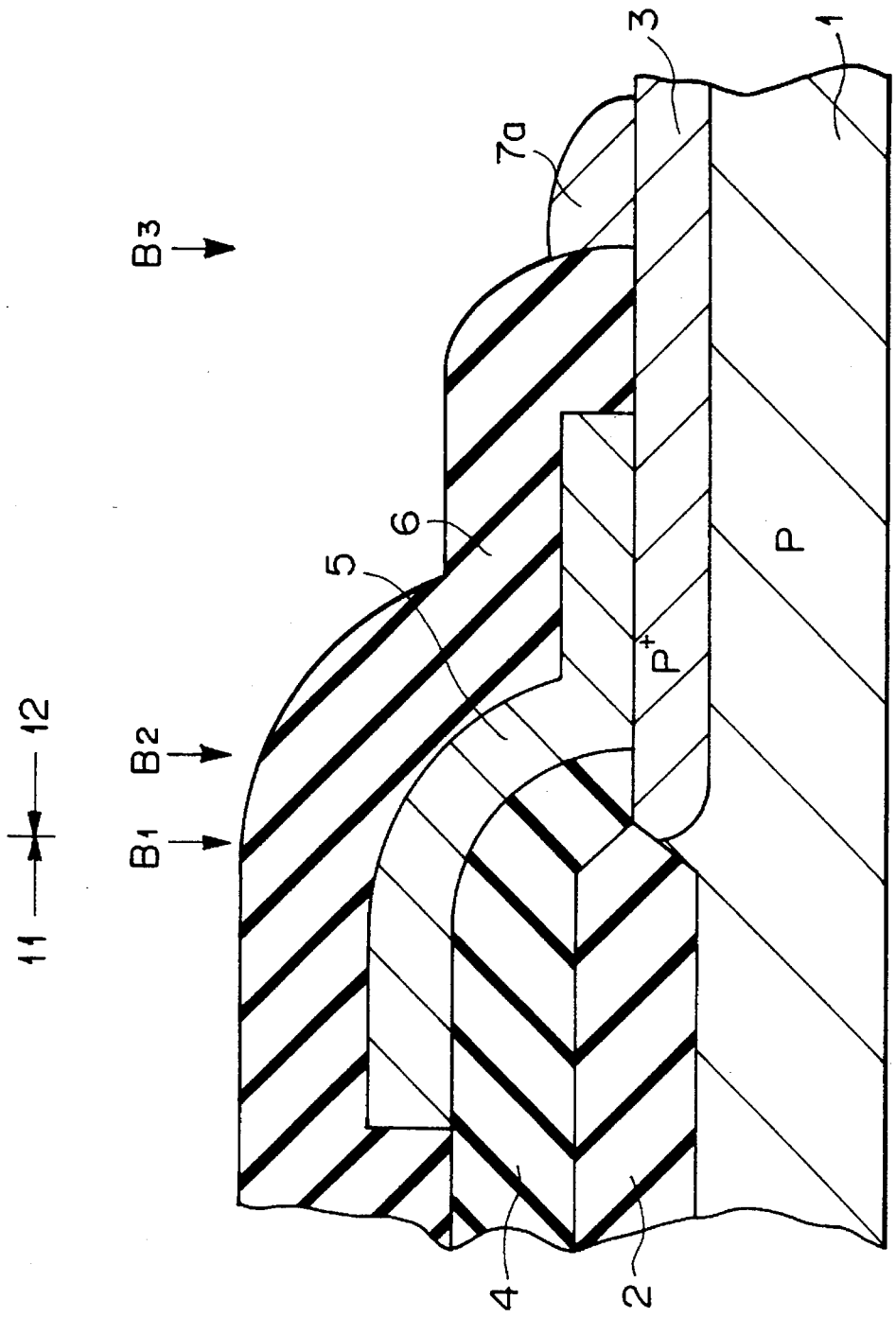
FIG. 3 is a cross-sectional view taken along the lines III—III of FIG. 2.

As illustrated in FIG. 2, which is an enlargement of the portion X of FIG. 1, the scribe connection layer 13 extends over a boundary $B_1$ of a field oxide layer 2 (see FIG. 3) and a boundary $B_2$ of a first insulating layer 4 (see FIG. 3). Note that $B_3$ designates a boundary $B_3$ of a second insulating layer 6.

In more detail, in FIG. 3, which is a cross-sectional view taken along the line III—III of FIG. 2, reference numeral 1 designates a P-type semiconductor substrate. Also, a field oxide layer 2 is formed by thermally oxidizing the semiconductor substrate 1. Reference numeral 3 designates a $P^+$-type impurity diffusion region formed in the scribe line area 12 of the semiconductor substrate 1 with a mask of the field oxide layer 2. Also, formed on the field oxide layer 2 is a first insulating layer 4. The insulating layer 4 is patterned, and a first aluminum connection layer 5 serving as the scribe connection layer 13 of FIG. 2 is formed thereon. In this case, the first aluminum connection layer 5 is electrically connected via the impurity diffusion region 3 to the semiconductor substrate 1. Further, formed on the first aluminum connection layer 5 is a second insulating layer 6 which is patterned to open a part of the scribe line area 12.

Figure 5:
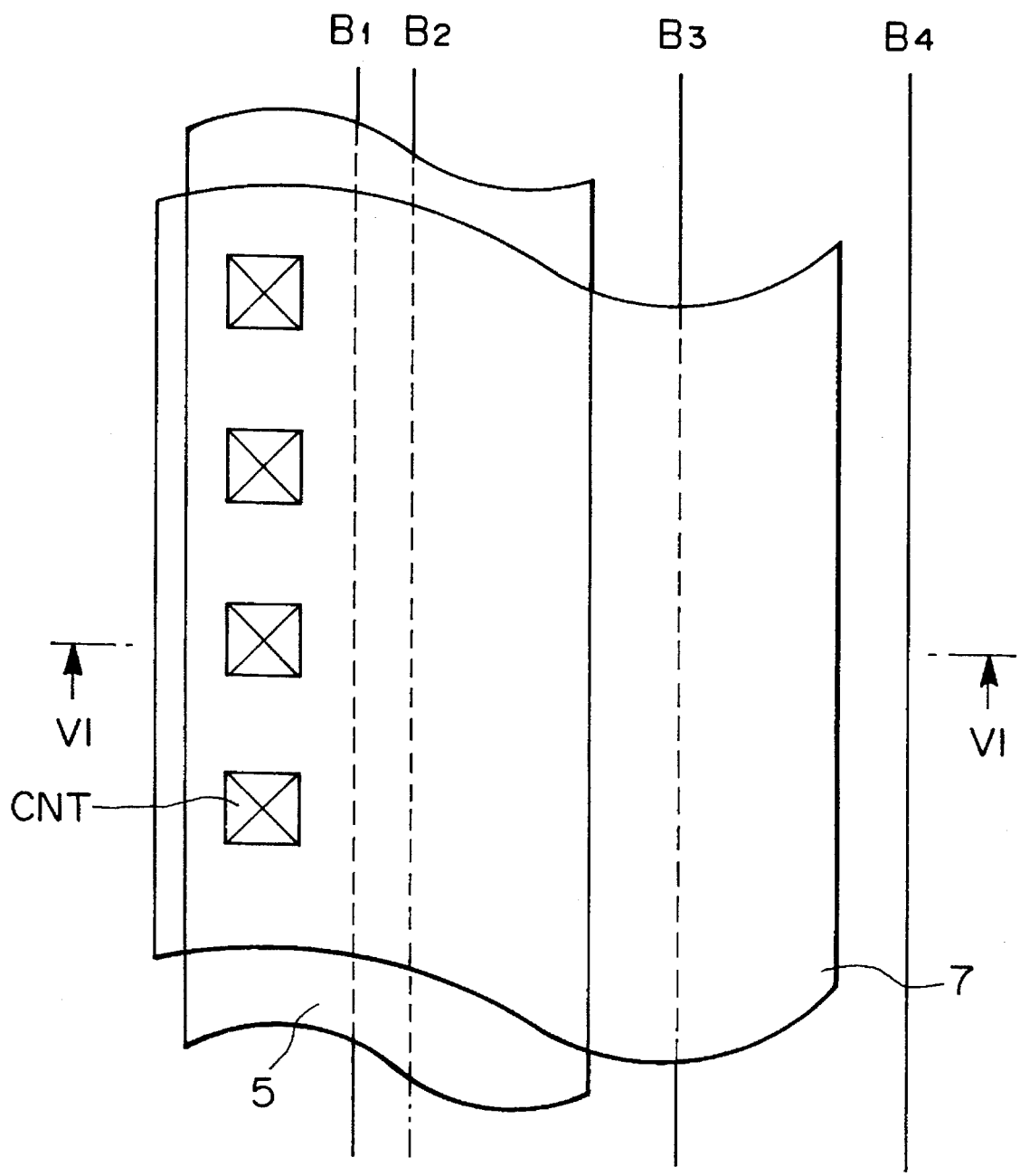
FIG. 5 is a plan view illustrating a first embodiment of the semiconductor device according to the present invention.

In the device of FIG. 3, however, after the formation of the second insulating layer 6, a second aluminum connection layer (not shown) which is necessary for the element forming area 11 may remain as a layer 7a in the scribe line area 12 after the patterning of the second aluminum connection layer. This remainder layer 7a is removed at a post stage process, thus inviting short-circuits in an internal circuit of the element forming area 11 (see: FIG. 5 of JP-A-HEI2-54563). Also, if the first aluminum connection layer 5 is used as a discharging line for an electrostatic protection circuit to discharge an electrostatic pulse therefrom to thereby protect the internal circuit, when a large surge current, such as several amperes within 1 ns in a charged device model (CDM), flows through the first aluminum connection layer 5, the temperature of the first aluminum connection layer 5 is increased due to the absence of a heat dissipation configuration, so that the first aluminum connection layer 5 may be melted.

Figure 4:
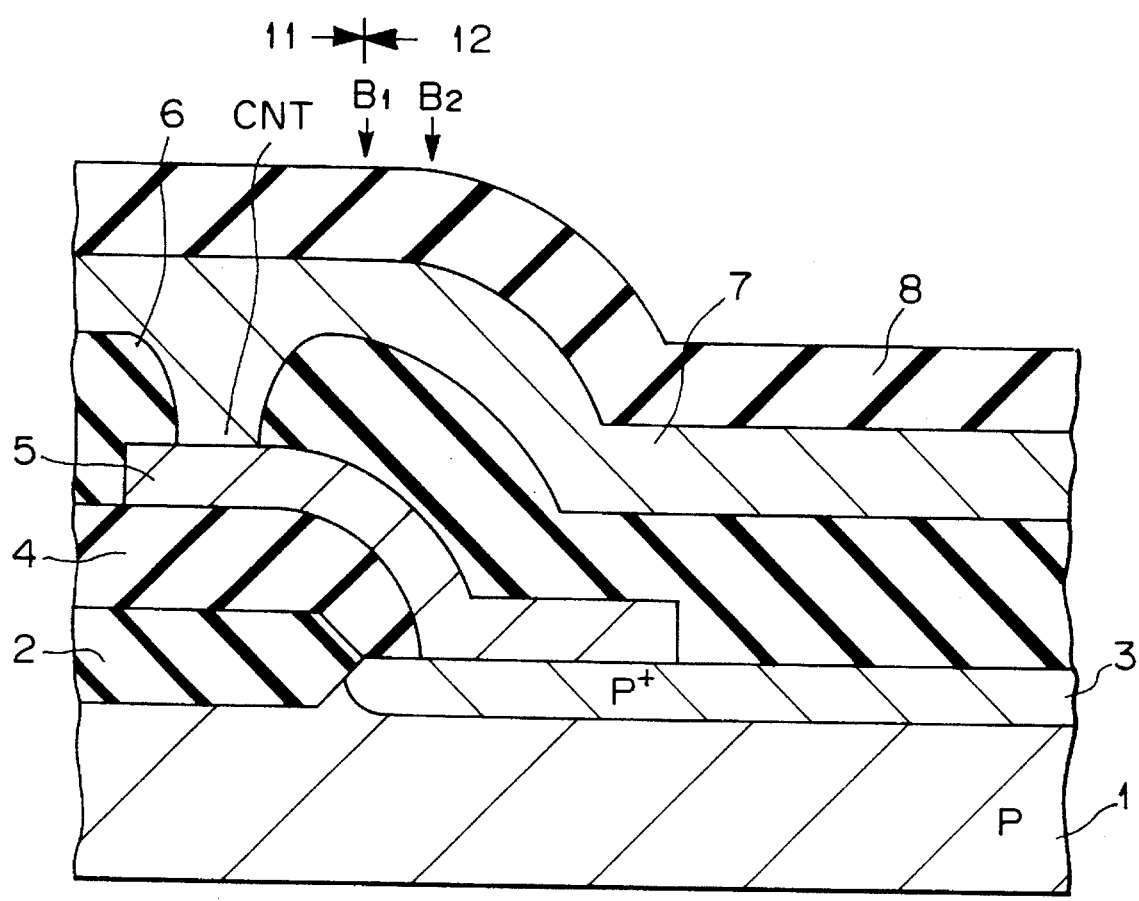
FIG. 4 is a cross-sectional view illustrating another prior art semiconductor device.

In order to eliminate the remainder layer 7a of the second aluminum connection layer and to adopt a heat dissipation configuration, this second aluminum connection layer per se remains in the scribe line area 12 to double the scribe connection layer 13 (see: JP-A-HEI1-94625). That is, as illustrated in FIG. 4, the second insulating layer 6 remains in the scribe line area 12, and also, a second aluminum connection layer 7 formed on the second insulating layer 6 also remains in the scribe line area 12. Also, the second aluminum connection layer 7 is connected via contact holes CNT to the first aluminum connection layer 5, to thereby adopt a heat dissipation configuration. Thus, the step between the element forming area 11 and the scribe line area 12 is further reduced.

In the device of FIG. 4, however, the heat dissipation is still insufficient, and therefore, when a large surge current flows through the first aluminum connection layer 5, the temperature thereof is increased, so that the first and second aluminum connection layers 5 and 7 may be melted down.

In FIG. 5, which illustrates a first embodiment of the present invention, the aluminum connection layers 5 and 7 are connected CNT to each other via contact holes. For example, the width of the first aluminum connection layer 5 is 5 μm, and the width of the second aluminum connection layer 7 is 8 μm. Also, each area of the contact holes CNT is 1 μm×1 μm, and the distance between the centers of the contact holes CNT is 2 μm.

Figure 6:
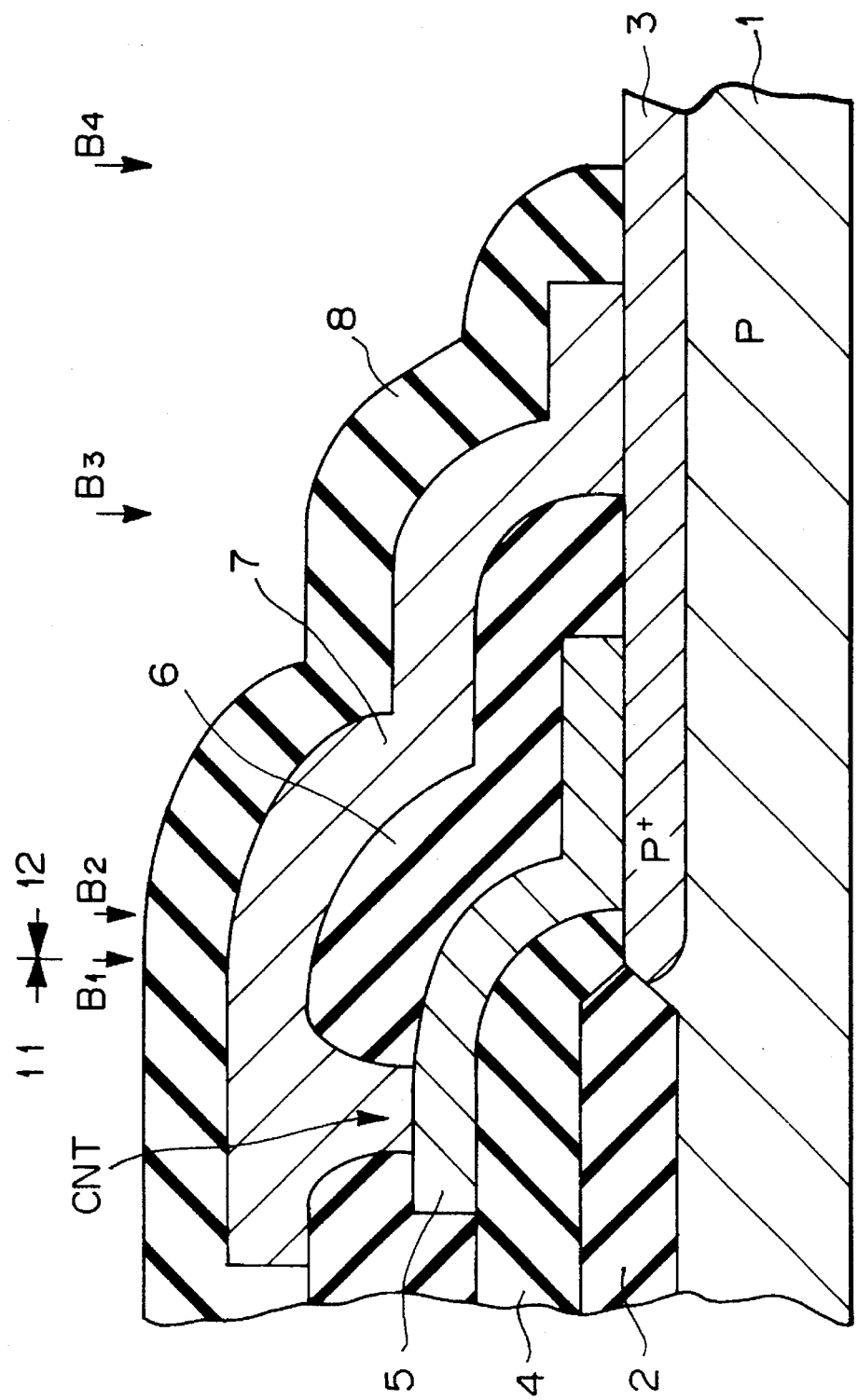
FIG. 6 is a cross-sectional view taken along the line VI—VI of FIG. 5.

As illustrated in FIG. 6, which is a cross-sectional view taken along the line VI—VI of FIG. 5, the aluminum connection layers 5 and 7 are both connected directly to the impurity region 3, and therefore, to the semiconductor substrate 1, thus enhancing the heat dissipation effect. For example, the semiconductor substrate 1 is made of silicon having a thermal conductivity of 1.5 W/cm·°C., and the second insulating layer 6 is made of silicon oxide having a thermal conductivity of 0.014 W/cm·°C., i.e., the thermal conductivity of the semiconductor substrate 1 is about 100 times large as that of the second insulating layer 6. Therefore, heat generated in the second aluminum connection layer 7 is rapidly transferred via the connection of the second aluminum connection layer 7 and the semiconductor substrate 1 to the semiconductor substrate 1. Also, the number of the contact holes CNT between the aluminum connection layers 5 and 7 is increased to increase the surface area of the second aluminum connection layer 7, thus enhancing the heat dissipation effect by the heat radiation and heat conductivity. For example, if the contact holes CNT are formed as explained above, the surface area of the second aluminum connection layer 7 is increased by about 20%.

Note that reference $B_4$ in FIGS. 5 and 6 designates a boundary of a passivation layer 8.

The device of FIG. 6 will now be explained with reference to FIGS. 7A through 7H.

Figure 7A:
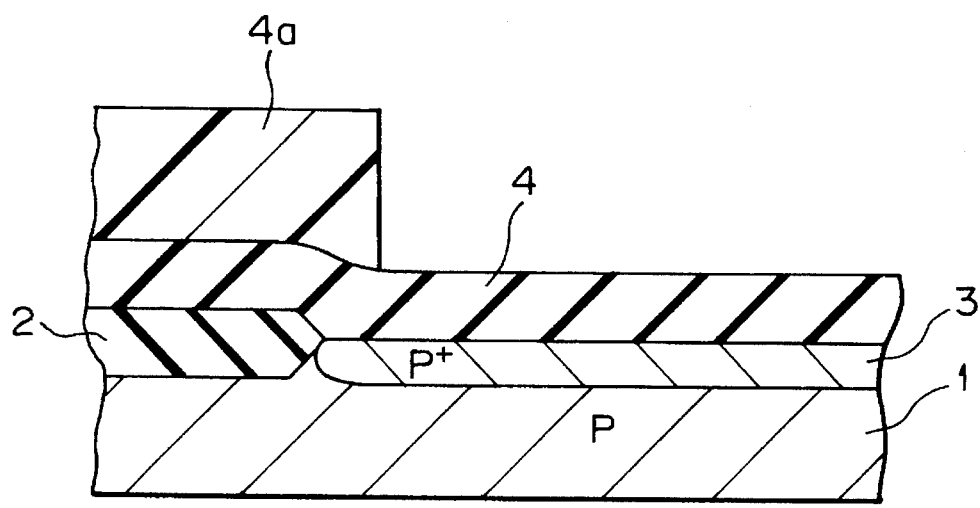
FIGS. 7A through 7H are cross-sectional views for showing the manufacturing steps of the semiconductor device of FIG. 6.

Referring to FIG. 7A, the field oxide layer 2 is grown by thermally oxidizing the semiconductor substrate 1. Then, P-type impurity ions such as boron ions are implanted into the semiconductor substrate 1 with a mask of the field oxide layer 2, thus creating the $P^+$-type impurity region 3 within the semiconductor substrate 1. Further, an 8000Å thick silicon oxide layer is deposited by a CVD process to form the first insulating layer 4. Then, formed on the first insulating layer 4 is a photoresist pattern 4a.

Figure 7B:
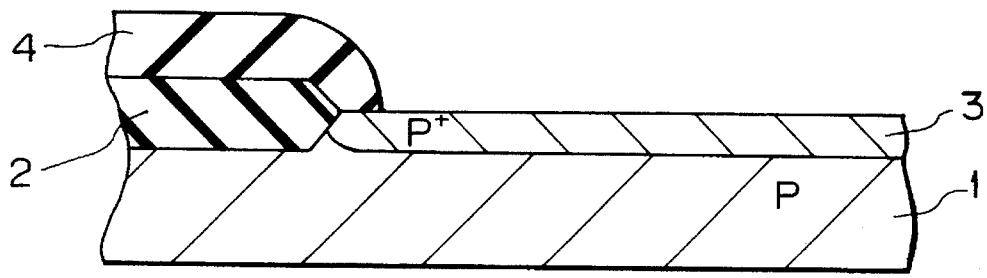

Next, referring to FIG. 7B, the first insulating layer 4 is etched with a mask of the photoresist pattern 4a. Then, the photoresist pattern 4a is removed.

Figure 7C:
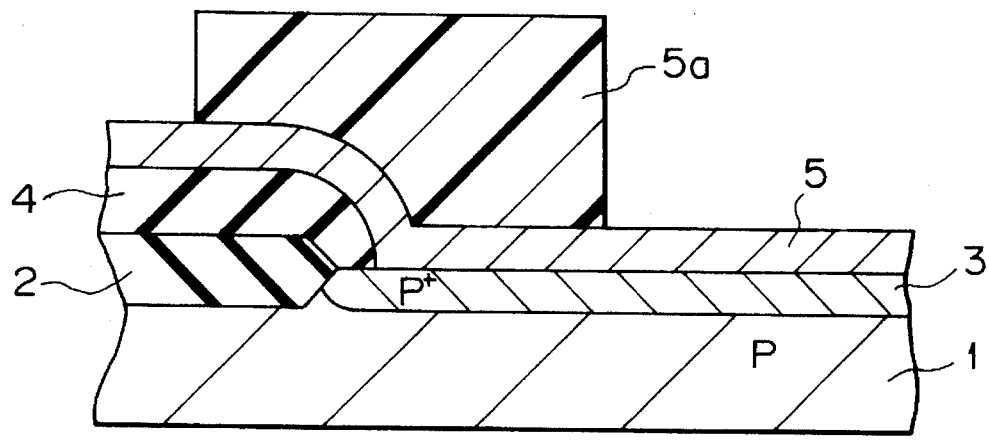

Next, referring to FIG. 7C, a 5000Å thick aluminum layer is deposited by a sputtering process to form the first aluminum connection layer 5. Then, formed on the first aluminum connection layer 5 is a photoresist pattern 5a.

Figure 7D:
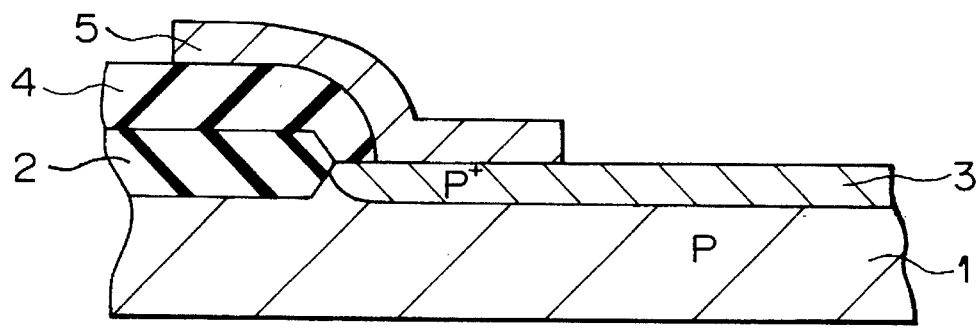

Next, referring to FIG. 7D, the first aluminum connection layer 5 is etched with a mask of the photoresist pattern 5a. Then, the photoresist pattern 5a is removed.

Figure 7E:
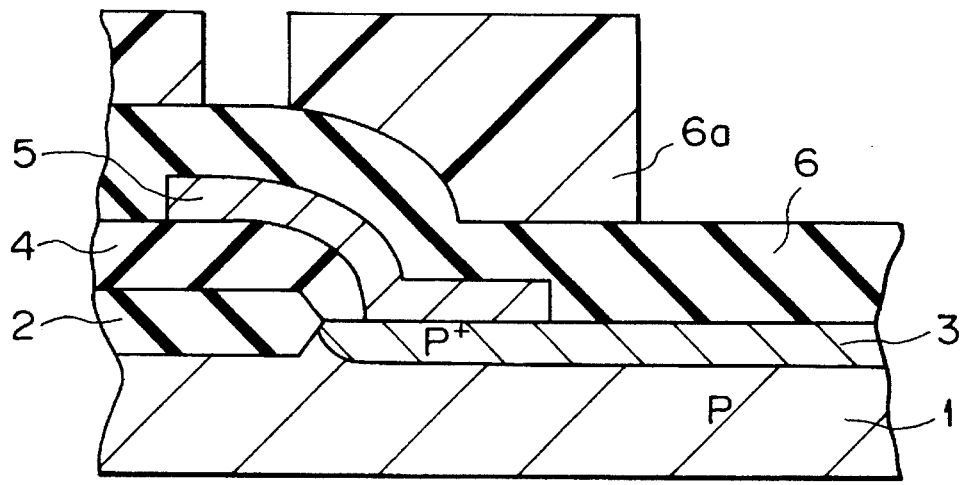

Next, referring to FIG. 7E, an 8000Å thick silicon oxide layer is deposited by a CVD process to form the second insulating layer 6. Then, formed on the second insulating layer 6 is a photoresist pattern 6a.

Figure 7F:
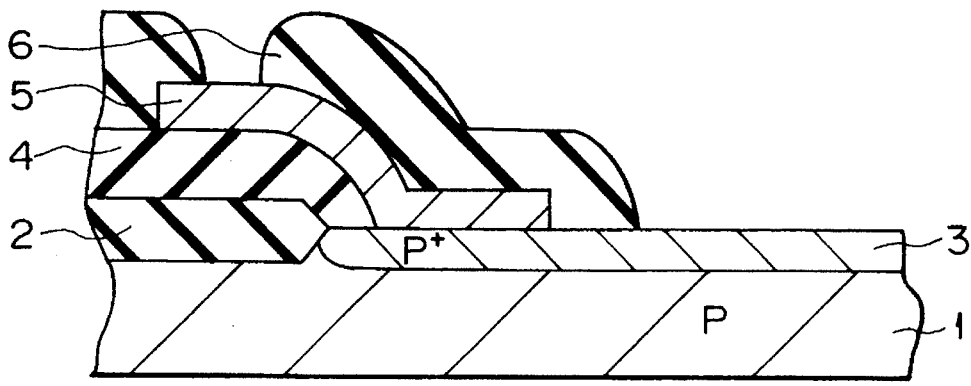

Next, referring to FIG. 7F, the second insulating layer 6 is etched with a mask of the photoresist pattern 6a. Then, the photoresist pattern 6a is removed.

Figure 7G:
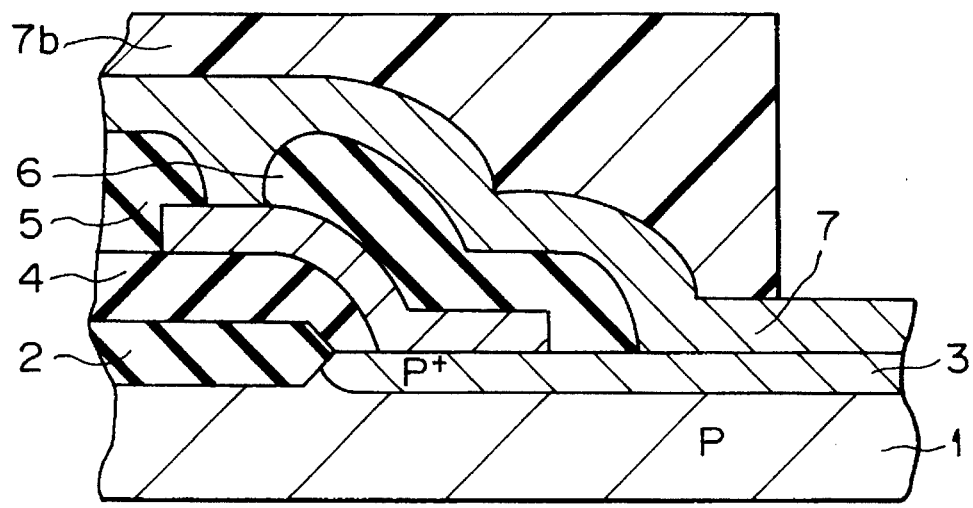

Next, referring to FIG. 7G, a 1000Å thick aluminum layer is deposited by a sputtering process to form the second aluminum connection layer 7. Then, formed on the second aluminum connection layer 7 is a photoresist pattern 7b.

Figure 7H:
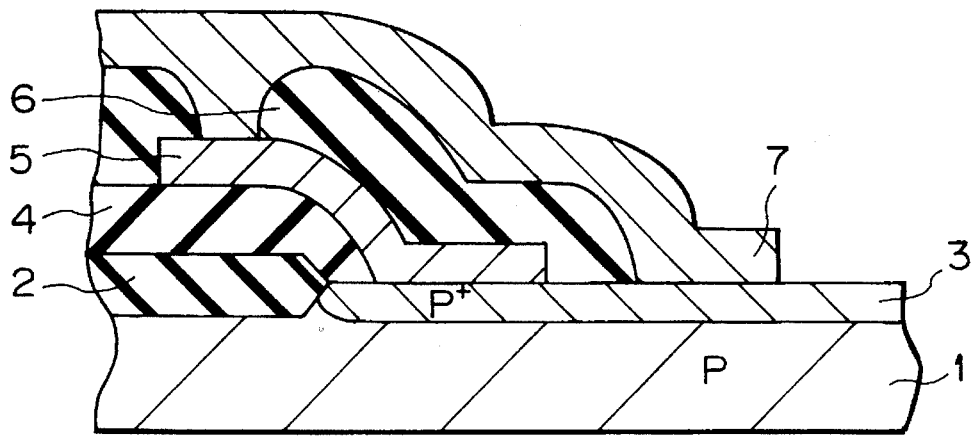

Next, referring to FIG. 7H, the second aluminum connection layer 7 is etched with a mask of the photoresist pattern 7b. Then, the photoresist pattern 7b is removed.

Finally, an 8000Å thick silicon nitride layer is deposited by a CVD process to form the passivation layer 8, thus obtaining the device of FIG. 6.

Figure 8A:
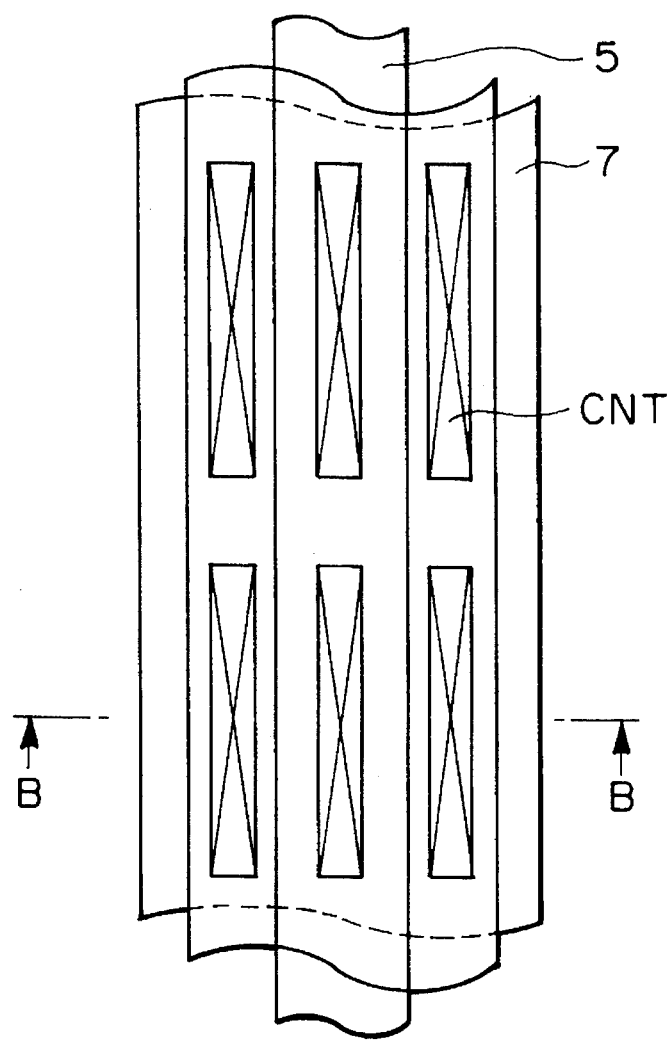
FIG. 8A is a plan view illustrating a second embodiment of the semiconductor device according to the present invention.
Figure 8B:
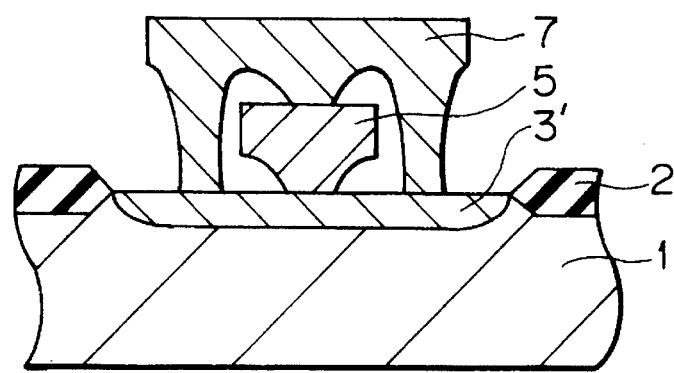
FIG. 8B is a cross-sectional view taken along the lines B—B of FIG. 8A.

FIG. 8A illustrates a second embodiment of the present invention and FIG. 8B is a cross-sectional view taken along the line B—B of FIG. 8A. In FIGS. 8A and 8B, the aluminum connection layers 5 and 7 are connected to an N-type impurity diffusion region 3' formed within the semiconductor substrate 1. In this case, the potential at the semiconductor substrate 1 is −2.0 V, and the potential at the aluminum connection layers 5 and 7 is 0 V, thus reversely biasing the impurity diffusion region 3' and the semiconductor substrate 1.

As explained hereinbefore, according to the present invention, the heat dissipation effect of scribe connections can be enhanced. Therefore, even when the scribe connections are used as discharging lines of a electrostatic protection circuit and a large surge current flows therethrough, the melting down of the scribe connections due to the increased temperature thereof can be avoided.

I claim:

1. A semiconductor device comprising:
   two metal connection layers formed on a scribe line area of a semiconductor substrate; and
   a first insulating layer formed between said metal connection layers;
   said metal connection layers being connected directly to each other, via contact holes, and directly to said semiconductor substrate.

2. A device as set forth in claim 1, wherein said contact holes are arranged along said scribe line area.

3. A device as set forth in claim 1, further comprising a second insulating layer formed on said semiconductor substrate and in an element forming area adjacent to said scribe line area,
   said metal connection layers overlying said second insulating layer.

4. A device as set forth in claim 3, wherein said contact holes are formed above said second insulating layer.

5. A semiconductor device comprising:
   a semiconductor substrate;
   an impurity region formed in a scribe line area of said semiconductor substrate;
   a first metal connection layer formed on said scribe line area and connected continuously and directly to said impurity region; and
   a second metal connection layer formed on said scribe line area and connected directly to said impurity region and to said first metal connection layer.

6. A device as set forth in claim 5, wherein a conductivity type of said semiconductor substrate is the same as that of said impurity region.

7. A device as set forth in claim 5, wherein a conductivity type of said semiconductor substrate is opposite to that of said impurity region.

8. A device as set forth in claim 6, further comprising a first insulating layer formed between said first and second metal connection layers.

9. A device as set forth in claim 6, further comprising a second insulating layer formed on said semiconductor substrate and in an element forming area adjacent to said scribe line area.

10. A device as set forth in claim 9, wherein said first metal connection layer is connected to said second metal connection layer via contact holes formed above said second insulating layer.

11. A semiconductor device comprising:

a semiconductor substrate;

an impurity region formed in a scribe line area of said semiconductor substrate;

a first insulating layer formed on said impurity region;

a first metal connection layer formed on said first insulating layer and connected directly to said impurity region via contact holes;

a second insulating layer formed on said first metal connection layer; and a second metal connection layer formed on said second insulating layer and connected directly to said impurity region via contact holes and directly to said first connection layer via contact holes.

12. A semiconductor device comprising:

a semiconductor substrate having an element forming area and a scribe line area around said element forming area;

a first insulating layer formed to cover said element forming area;

a first connection layer formed in contact with said scribe line area and elongated over said first insulating layer to form an elongated portion;

a second insulating layer formed to cover said first connection layer;

a contact hole selectively formed in said second insulating layer to expose a part of said elongated portion of said first connection layer; and a second connection layer formed on said second insulating layer in contact with said part of said elongated portion of said first connection layer via said contact hole and elongated to be in contact with said scribe line area.

* * * * *